United States Patent [19]

Peacock

[11] Patent Number: 5,087,881
[45] Date of Patent: Feb. 11, 1992

[54] IC ENGINE CYLINDER OUTPUT POWER MEASUREMENT APPARATUS BY MONITORING THE OUTPUT OF AN ALTERNATOR DRIVEN BY THE ENGINE

[76] Inventor: David J. H. Peacock, 200-204 Bye Pass Rd., Chilwell, Nottingham NG9, England

[21] Appl. No.: 476,380
[22] PCT Filed: Sep. 19, 1989
[86] PCT No.: PCT/GB89/01094
  § 371 Date: May 17, 1990
  § 102(e) Date: May 17, 1990
[87] PCT Pub. No.: WO90/03558
  PCT Pub. Date: Apr. 5, 1990

[30] Foreign Application Priority Data
Sep. 19, 1988 [GB] United Kingdom ............ 8814759

[51] Int. Cl.[5] ................................ F02P 17/00
[52] U.S. Cl. ..................... 324/378; 73/117.3; 324/379; 324/402
[58] Field of Search ........... 324/378, 379, 384, 391, 324/402, 390; 73/117.3, 117.2, 116

[56] References Cited
U.S. PATENT DOCUMENTS 3,908,167 9/1975 Hulls et al. ..................... 324/166
3,972,230 8/1976 Hanson et al. ................. 73/116
4,417,467 11/1983 Higgs et al. .................. 324/378 X
4,795,979 1/1989 Kreft et al. ................... 324/379
4,812,979 3/1989 Hermann et al. ............. 73/117.3 X
4,932,379 6/1990 Tang et al. ................... 73/117.3 X

FOREIGN PATENT DOCUMENTS 574374 4/1959 Canada ....................... 324/379
0031290 7/1981 European Pat. Off. .

OTHER PUBLICATIONS

Patent Abstract of Japan, vol. 10, No. 41, p. 429 (2098), Feb. 18, 1986, and JP, 60-188826, Sep. 26, 1985.

Primary Examiner—Gerard R. Strecker
Assistant Examiner—Robert W. Mueller
Attorney, Agent, or Firm—Kirschstein, Ottinger, Israel & Schiffmiller

[57] ABSTRACT

The apparatus for measuring the comparative output power of each cylinder of a multi-cylinder engine comprises a digital signal processor 1 and a phase locked loop detector 2. By inputting instantaneous current measurements from (e.g.) a current transformer attached to an alternator output of an engine under test and analysing same in the processor 1, instantaneous engine speed may be measured. This measurement may be processed to determine comparative measurements of compression and power output of each of the cylinders.

11 Claims, 4 Drawing Sheets

IC ENGINE CYLINDER OUTPUT POWER MEASUREMENT APPARATUS BY MONITORING THE OUTPUT OF AN ALTERNATOR DRIVEN BY THE ENGINE

BACKGROUND OF THE INVENTION

1. Field of the Invention

The present invention relates to power measurement apparatus and more particularly to power measurement apparatus for use as a diagnostic aid in maintenance of internal combustion engines.

2. Description of Related Art

Some known apparatus for measuring the comparative power output of each cylinder of an internal combustion engine of the kind having two or more cylinders requires measurement to be effected on the output shaft of the engine. Such apparatus is not usually suitable for use with an engine in situ in a motor vehicle for example and may require use of purpose built testing rigs. Thus the performance of an engine under its normal working conditions is not practical.

SUMMARY OF THE INVENTION

Accordingly it is an object of the present invention to provide power measurement apparatus for use in measuring the comparative power outputs of the cylinders of an internal combustion engine, the apparatus being capable of use without affecting the working conditions of such an engine.

Acoording to the present invention there is provided power measurement apparatus for measuring the comparative output power of each cylinder of an internal combustion engine of the kind having at least two cylinders, the apparatus comprising first pick-up means for detecting current flow in an output lead of an electrical generator, second pick-up means for detecting engine timing pulses and, comparison means to compare the level of current flows in respect of each power stroke of the engine whereby the comparative power output of each cylinder of the engine may be determined.

Preferably the first pick-up means is a current transformer adapted for releasable attachment to an alternator output lead.

The second pick-up means may be a current transformer for attachment to a spark plug lead or injection control lead for example, or may be an electrically conducting clip for attachment to a timing pulse output.

BRIEF DESCRIPTION OF THE DRAWINGS

Power measurement apparatus in accordance with the invention will now be described by way of example only with reference to the accompanying drawings in which.

DETAILED DESCRIPTION OF THE PREFERRED EMBODIMENTS

Figure 1:
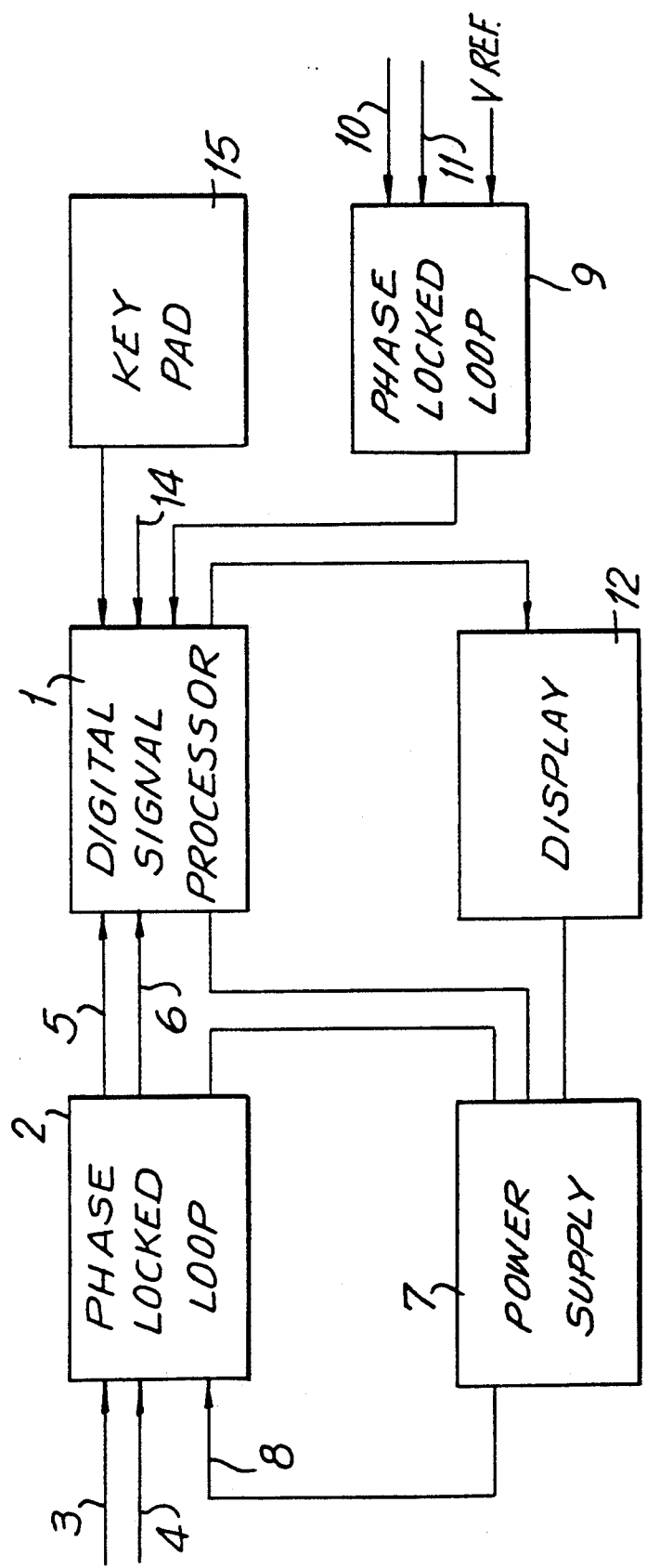
FIG. 1 is a block schematic diagram of the apparatus.

Referring first to FIG. 1, the apparatus comprises a digital signal processor 1, for example an eight bit microprocessor which receives a signal indicative of instantaneous engine speed from a phase locked loop circuit 2.

The phase locked loop circuit 2 is connected by way of inputs 3 and 4 to a current transformer of the kind detachably connectable to an alternator lead of a vehicle engine in a non-intrusive manner. The current transformer (not shown) detects the high frequency component of the alternator output. This signal is directly related to the instantaneous speed of the engine main shaft by a factor determined by the gearing between the main shaft and the alternator shaft and the number of poles and phases which the alternator has.

It will be appreciated that any engine running at an apparently constant speed (say 1500 revolutions per minute) is in practice running faster and slower than the nominal speed at any particular instant of time. This variation is dependant on the position in the engine cycle at the instant of measurement. Thus immediately after firing of a cylinder, the instantaneous power increase results in an instantaneous acceleration followed by a deceleration until the next power stroke of another cylinder.

Since the instantaneous acceleration provided is dependent upon the power input, each cylinder of a multi-cylinder engine will have an instantaneous effect dependant upon its power. Thus by measuring instantaneous engine speeds with respect to a known instant, it is possible to determine the comparative power contributions of each cylinder. Accordingly by detecting the variations in the high frequency component of the alternator output it is possible to deduce the contribution of each cylinder to the instantaneous engine speed.

Returning to FIG. 1, the phase locked loop circuit 2 amplifies the signal received from the current transformer at the inputs 3 and 4 and filters the signal to reduce noise and impulse effects. This provides a signal of sufficient amplitude to drive the phase locked loop detector itself.

The phase locked loop detector is arranged to operate either in a phase-to-voltage conversion mode or in a frequency-to-voltage conversion mode. In phase conversion mode a very high degree of sensitivity is achieved which may be used for engine measurement when the engine is lightly loaded and the consequent variation in instantaneous engine speed is small.

An engine loading increases the variation in instantaneous speed may be too great which may cause saturation of the phase locked loop detector. Thus the phase locked loop follows the frequency of the input signal and outputs an analogue voltage signal on leads 5,6, proportional to the phase or frequency deviation. The analogue voltage output is filtered to remove high frequency components and is buffered and amplified to provide a signal of sufficient amplitude to drive an analogue to digital converter at the input to the processor 1.

It is here noted that the such phase locked loop detector circuit 2 requires a stabilised reference voltage. Hence a power supply, unit 7, is arranged to derive a reference voltage for application by way of an input 8 of the detector circuit 2. The power supply, unit 7, also provides power to the other circuits of the apparatus and may be arranged to derive its power from the vehicle battery or from another source such as an independent battery or a mains electricity source.

The digital signal is sampled at a much higher frequency than the engine speed, triggering of sampling of the output of the analogue to digital converter being with reference to a known point in the engine cycle. For the purpose of detecting the known point a second phase locked loop detector, circuit 9, is provided—this having its inputs 10 and 11 connected to a further current transformer for non-intrusive coupling to, for example, a sparking plug lead of a petrol engine or a fuel injection control point of a disel engine. The second phase locked loop runs at 2048 times the engine speed thus causing 2048 samples to be taken per engine cycle.

The processor 1 averages the signal samples and relates them to the cyclic position of the engine to provide an output to a display unit 12. The display unit 12 may be an oscilloscope type trace display enabling the relative power of the engine to be observed throughout its cycle. Alternatively, the processor may analyse the area under the curve to provide a direct analysis of the relative performance of each cylinder of an engine thus enabling a diagnostic display and print-out if desired, of the relative power of each cylinder.

The processor 1 is also provided with an auxiliary channel input 14 to permit a direct input of any electrical function of the engine such as contact breaker pulses, ignition pulses, injection control pulses and the like for analysis and display, or with appropriate transducers instantaneous manifold pressure (for example) can be analysed and displayed.

Selection of operation mode of the processor 1 may be made by use of a keypad 15.

The processor 1 has a memory mapping facility which enables it to provide to the display 12 graphics of amplitude with engine cycle graduation. It is also possible to use this function to perform a memory trace function of either the main input signals or the auxiliary channels. A further facility using (eg) the auxiliary channel input to monitor a spark plug lead for example may be a freeze function. Thus if a particular cylinder fails to fire, the engine conditions immediately before the failure may be displayed to facilitate diagnosis of so-called transient faults.

Figure 2:
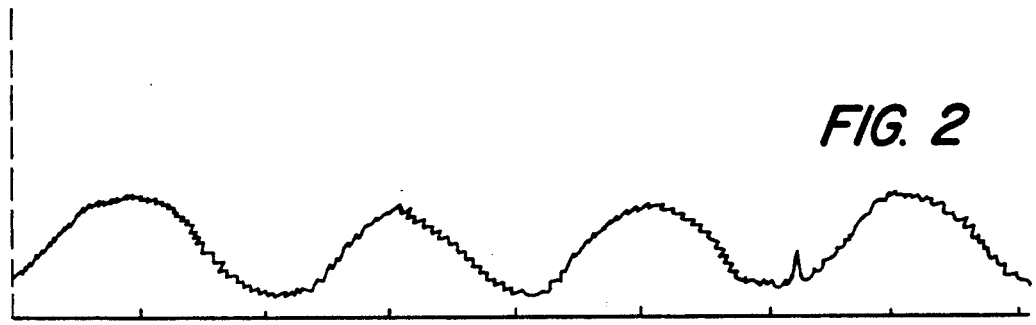
FIG. 2 is a waveform diagram showing the instantaneous speed effects.
Figure 3:
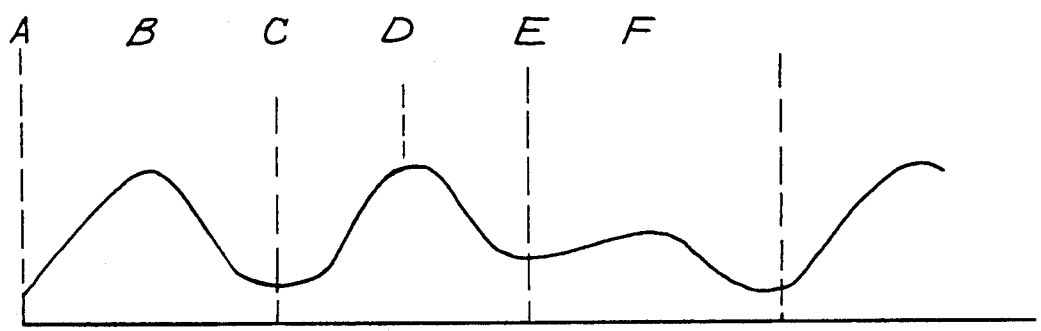
FIG. 3 is a stabilised waveform showing certain power variation effects.
Figure 4:
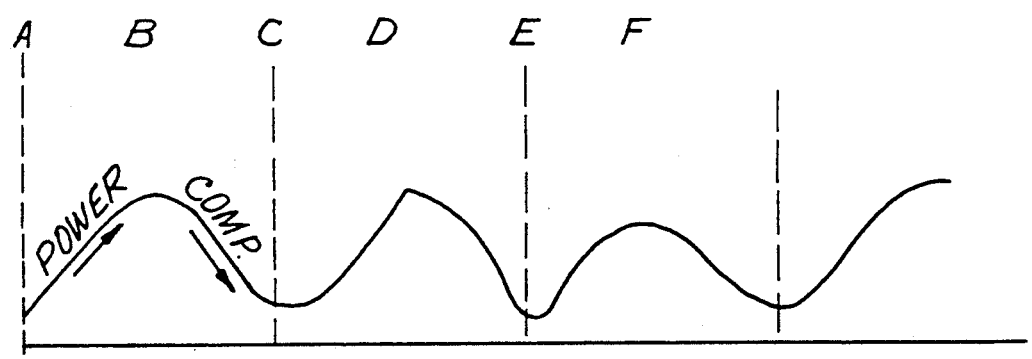
FIG. 4 is a stabilised waveform showing other power variation effects.

Now referring to FIGS. 2 to 4, FIGURES shows a typical instantaneous output from a normal four cylinder engine in which all four cylinders are contributing approximately equal power outputs. This signal is shown prior to processing (i.e. averaging) of the signal by the processor 1 of FIG. 1. After processing, this signal would appear as a substantially regular sinewave.

However, supposing for example the third cylinder developed a fault then, in dependance on the fault type, the output trace will change. Thus as shown in FIG. 3, the third cylinder after the trigger pulse has low compression and low power output. Thus the power stroke of the first cylinder causes an increase in instantaneous speed in the area A-B. Increasing compression before the second cylinder fires causes a decrease in the area B-C whilst the power stroke of the second cylinder causes an increase in area C-D.

Note however, that the decrease in instantaneous speed in the area D-E is much less marked thus indicating a loss of compression in the third cylinder whilst the increase in speed at E-F is less marked indicating lower power than the other cylinders.

Now in FIG. 4, the effect of a cylinder which has not lost compression but is contributing low power may be seen.

In the area A-D, the first two cylinders to fire after the trigger point are showing good power (the rising edge) and good compression (the falling edge) and the compression of the third cylinder has a similar instantaneous speed reduction effect. However, the maximum instantaneous speed peak for the third cylinder is lower, thus indicating a lower power input.

Figure 5:
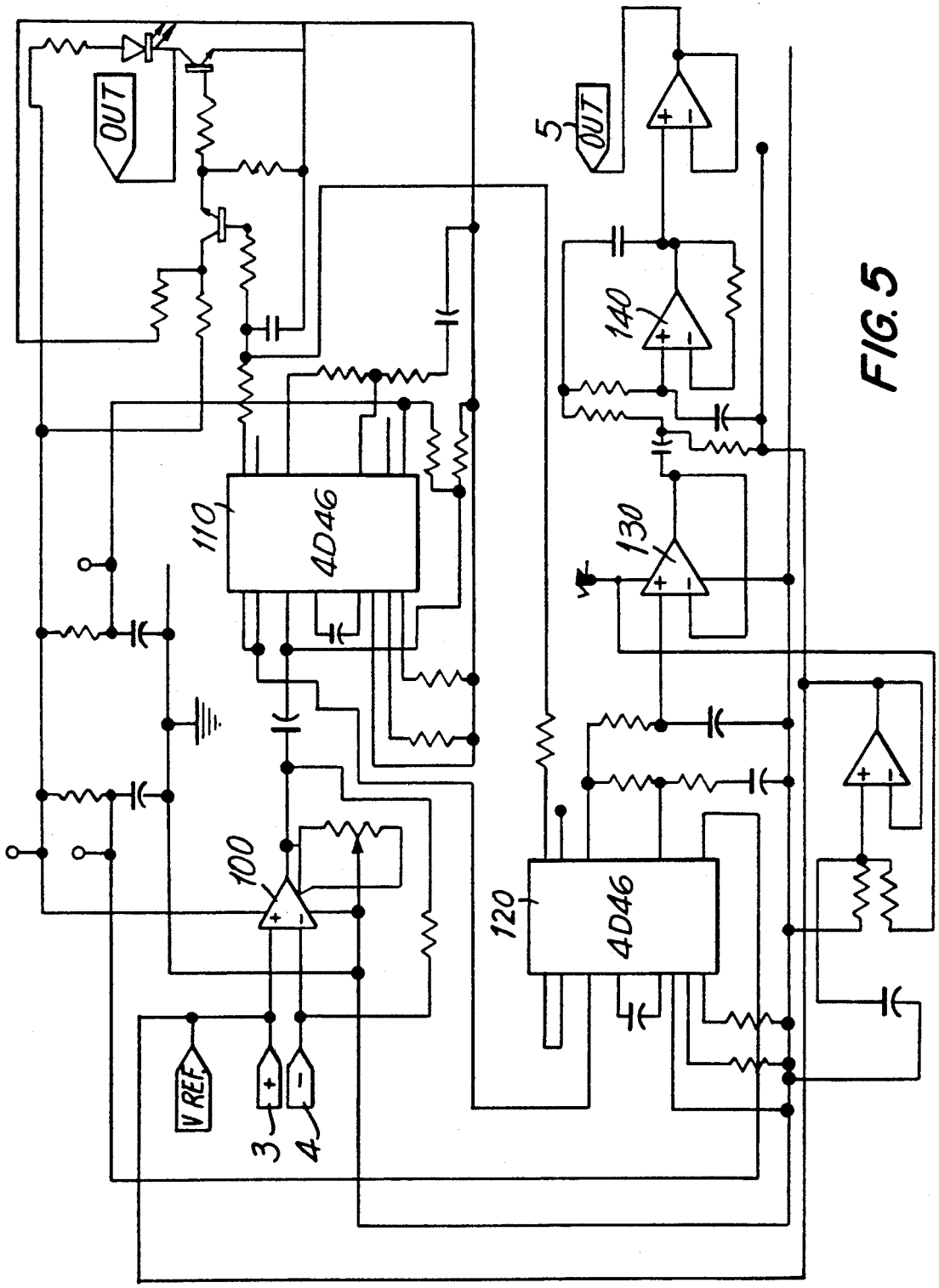
FIG. 5 is a circuit diagram of the phase locked loop detector current of FIG. 1, and, FIG. 6 is a diagrammatic illustration showing the apparatus of FIG. 1, in use.

Now referring to FIG. 5, the circuit of the phase locked loop detector circuit 2 of FIG. 1 may be seen. This circuit comprises an amplifier 100 on the input leads 3,4, from the sensor. The output of the amplifier 100 is filtered and provided to a first phase lock loop integrated circuit 110. The output of the phase lock loop 110 feeds a second phase lock loop integrated circuit 120 and is then amplified and filtered through stages 130 and 140 for output to the processor 5 on the output lead 150.

The apparatus hereinbefore described may be used on low load conditions, for example in a stationary vehicle with low engine speeds up to, say, 2000 rpm and is also suited to use in "snap" acceleration tested. Alternatively, the apparatus can be used to provide diagnosis of a vehicle under normal running conditions. Thus, the performance of an engine under load (in which power peaks are emphasised) can be measured with the apparatus, for example on the front passenger seat of a vehicle.

Figure 6:
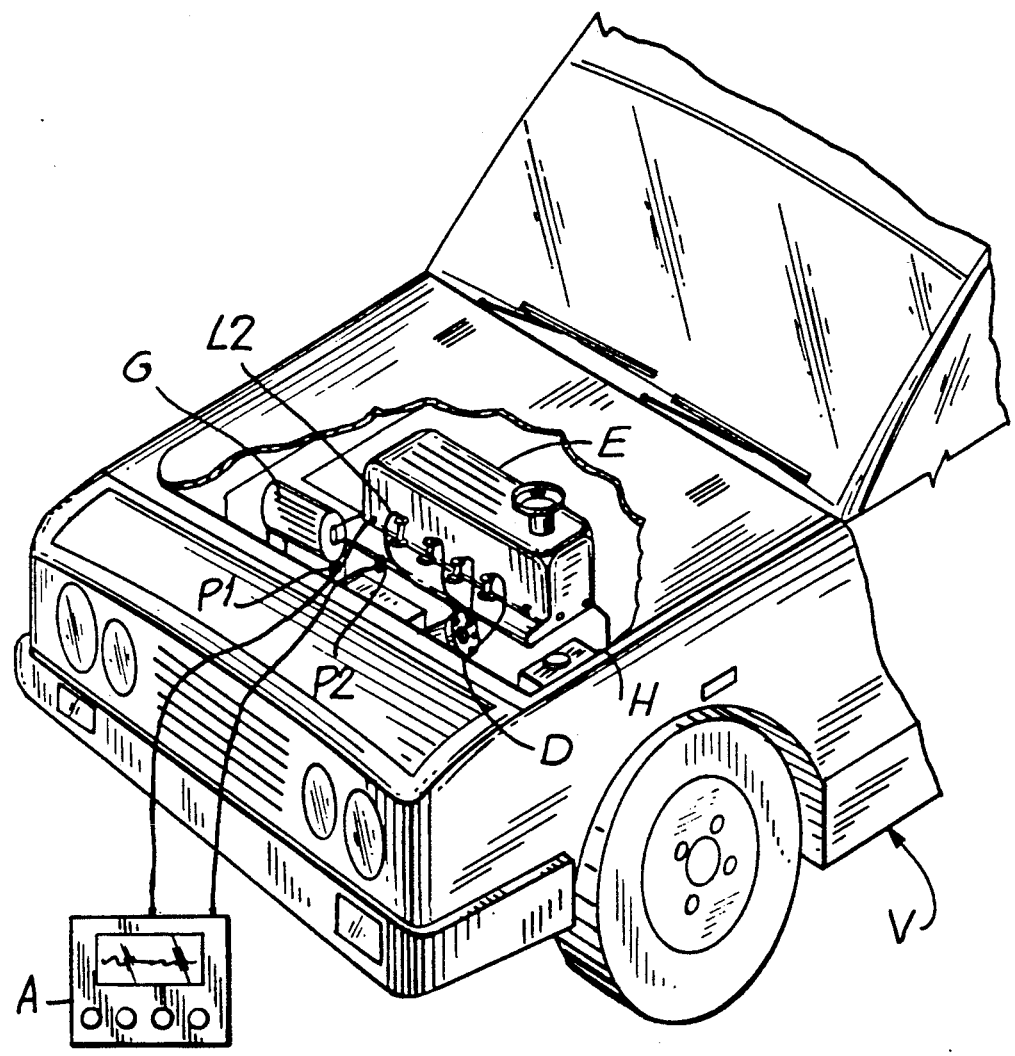

FIG. 6 shows the apparatus of FIG. 1 in use in a stationary vehicle. The apparatus is indicated at A and is shown monitoring the performance of internal combustion engine E in its normal operating position within an engine housing H of a vehicle V.

A first pick up means P1 is detachably connected in a non intrusive manner to a lead L1 of an alternator or generator G which is driven in the usual way from the engine E. The first pick up means P1 comprises a transformer in which current is induced by the current passing through the lead L1 to the alternator G. The first pick up means is connected to the inputs 3,4, of the processor 1.

A second pick up means P2 is detachably connected in a non intrusive manner to a spark plug lead L2 which extends from a spark plug to a distributor D. A second pick up means P2 comprises a transformer in which current is induced by the current passing through the lead L2. The second pick up means P2 is connected to the inputs 11 and 12 of processor 9.

I claim:

1. Power measurement apparatus for measuring the comparative output power of each cylinder of an internal combustion engine of the kind having at least two cylinders, the apparatus comprising first pick-up means for detecting current flow in an output lead of an electrical generator driven by the engine, second pick-up means for detecting engine timing pulses and comparison means to compare the levels of current flows from said first pick-up means in respect of each power stroke of the engine whereby the comparative output of each cylinder of the engine may be determined.

2. Power measurement apparatus as claimed in claim 1 wherein the first pick-up means comprises a current output transformer releasably attachable to the output lead of the electrical generator.

3. Power measurement apparatus as claimed in claim 1 wherein the second pick-up means comprises a current output transformer releasably attachable to a current carrying load.

4. Power measurement apparatus as claimed in claim 1 wherein the second pick-up means comprises an electrically conducting clip releasably attachable to a timing pulse output point.

5. Power measurement apparatus as claimed in claim 1 in which the comparison means comprises a microprocessor responsive to the outputs of said first and second pick-up means to provide an output signal representing power output between timing pulses averaged over a multiplicity of engine cycles.

6. Power measurement apparatus as claimed in claim 5 wherein the microprocessor output is displayed as an oscilloscope trace.

7. A method of measuring the comparative output power of each cylinder of an internal combustion engine having at least two cylinders comprising the steps of detecting with a first pick-up means, current flowing in an output lead of an electrical generator driven by the engine, detecting with a second pick-up means engine timing pulses, and comprising the level of current flows from said first pick-up means in respect of each power stroke of the engine to determine the comparative power output of each cylinder of the engine.

8. A method as claimed in claim 7 wherein the method is performed on an internal combustion engine in its normal operating position.

9. Power measurement apparatus for measuring the comparative output power of each cylinder of an internal combustion engine of the kind having at least two cylinders, the apparatus comprising: first pick-up means for detecting current flow in an output lead of an electrical generator driven by the engine; second pick-up means for detecting engine timing pulses; and comparison means for comparing the levels of current flows from said first pick-up means in respect of each power stroke of the engine, whereby the comparative output of each cylinder of the engine may be determined, said comparison means including a microprocessor responsive to the outputs of said first and second pick-up means to provide an output signal representing power output between timing pulses averaged over a multiplicity of engine cycles, said output of the first pick-up means driving a phase locked loop detector which converts alternator output signals to a corresponding analog voltage output.

10. Power measurement apparatus as claimed in claim 9 including an analogue to digital converter interposed between the output of the phase locked loop detector and an input of the microprocessor.

11. Power measurement apparatus as claimed in claim 9 wherein the detector is automatically switchable between frequency to voltage conversion and phase to voltage conversion whereby sensitivity of the apparatus may be varied.

* * * * *